(12) United States Patent
Lo et al.

(10) Patent No.: US 6,582,641 B1
(45) Date of Patent: Jun. 24, 2003

(54) APPARATUS AND METHOD FOR MAKING METAL OXIDE SPUTTERING TARGETS

(75) Inventors: Chi-Fung Lo, Fort Lee, NJ (US); John Turn, Chestnut Ridge, NY (US)

(73) Assignee: Praxair S.T. Technology, Inc., North Haven, CT (US)

( * ) Notice: Subject to any disclaimer, the term of this patent is extended or adjusted under 35 U.S.C. 154(b) by 0 days.

(21) Appl. No.: 08/295,593

(22) Filed: Aug. 25, 1994

(51) Int. Cl.$^7$ .............................. B29C 67/00; B28B 7/36
(52) U.S. Cl. ........................ 264/125; 264/109; 425/352; 425/812
(58) Field of Search ................................. 264/120, 332, 264/DIG. 36, 125, 109; 425/420, 812, 352; 501/126, 134

(56) References Cited

U.S. PATENT DOCUMENTS

| | | | |
|---|---|---|---|
| 716,343 A | * 12/1902 | Locke ......................... | 425/420 |
| 2,886,849 A | * 5/1959 | Brierley ...................... | 425/420 |
| 3,892,835 A | * 7/1975 | Holdsworth ................. | 264/332 |
| 4,049,523 A | 9/1977 | Boehnke et al. | |
| 4,094,672 A | 6/1978 | Fleck et al. .................... | 419/42 |
| 4,131,444 A | * 12/1978 | Walker et al. ................. | 264/82 |
| 4,382,053 A | * 5/1983 | Rigby ......................... | 264/120 |
| 4,386,040 A | * 5/1983 | Baumgartner ............... | 264/618 |
| 4,489,032 A | * 12/1984 | Ezis et al. .................... | 264/332 |
| 4,632,793 A | * 12/1986 | Ezis et al. ..................... | 264/58 |
| 4,647,548 A | * 3/1987 | Klein ......................... | 501/134 |
| 5,094,787 A | 3/1992 | Nakajima et al. .............. | 264/65 |
| 5,145,811 A | * 9/1992 | Lintz et al. .................... | 501/95 |
| 5,160,675 A | 11/1992 | Iwamoto et al. ............... | 264/56 |

FOREIGN PATENT DOCUMENTS

| | | |
|---|---|---|
| DE | 2316348 | 4/1972 |
| DE | 4124471 | 6/1992 |
| EP | 0342537 | 11/1989 |
| GB | 1220592 | 1/1971 |
| GB | 1415482 | 11/1975 |
| JP | 5642612 | 4/1981 |
| JP | 5879872 | 5/1983 |
| JP | 243356 | 2/1990 |
| JP | 3199373 | 8/1991 |
| JP | 4074860 | 3/1992 |
| JP | 4154654 | 5/1992 |
| JP | 4293769 | 10/1992 |
| JP | 4341504 | 11/1992 |
| WO | 8401369 | 4/1984 |

OTHER PUBLICATIONS

"Electroceramics Materials • properties • applications", A.J. Moulson et al., pp. 353–355, 1990.

"Vapor–phase processing converts refractory metals into ceramics", G.W. Billings, Tech Spotlight, pps. 45 & 46, Advanced Materials & Processes, 4/93.

"Kinetic Studies on the Oxidation of Carbon Monoxide over Pure, Reduced, and Doped Indium Sesquioxides", Sung Han Lee et al., Int'l. J. of Chem. Kinetics, vol. 19, 1–2 (1987).

Brochure: "NX–100™ Series of Titanium Carbide Coated Graphite", Lanxide Corp. (undated).

* cited by examiner

Primary Examiner—Stephen J. Lechert, Jr.
(74) Attorney, Agent, or Firm—Turie A. Schwartz (57) ABSTRACT

An apparatus and process for making metal oxide sputtering targets from volatile and thermally unstable metal oxide powder by hot-pressing the metal oxide powder in a graphite die assembly having a ceramic barrier sleeve disposed therein to isolate the metal oxide powder from the graphite die assembly components.

15 Claims, 3 Drawing Sheets

APPARATUS AND METHOD FOR MAKING METAL OXIDE SPUTTERING TARGETS

FIELD OF THE INVENTION

The present invention relates to the manufacture of sputtering targets, more particularly to the manufacture of sputtering targets from volatile and thermally unstable metal oxides, and even more particularly to the manufacture of indium oxide and tin oxide sputtering targets.

BACKGROUND OF THE INVENTION

Thin films are often produced using plasma sputtering techniques. Targets are used during the sputtering process as the source of material for the film being deposited onto a substrate. Targets made from volatile and thermally unstable metal oxides have been used to sputter thin films which exhibit properties useful in a variety of applications. For example, thin films of electro-optic materials, such as indium oxide and tin oxide, are known to exhibit high transmittance and low resistivity. These materials are commonly used as electro-conductive films in electroluminescence (EL) displays, liquid crystal displays, solar cells, defrost/defog heaters for airplanes and the like.

Known methods of making sputtering targets from such volatile and thermally unstable metal oxides have included consolidating, such as by hot-pressing, powders of the metal oxide target starting material, like $In_2O_3$ and $SnO_2$, into a target blank in an inert gas environment. Graphite or ceramic die assemblies with a die cavity typically have been used to press the powdered material. In a number of these prior processes, in particular prior processes for making indium oxide and tin oxide (ITO) targets, the metal oxide powder was loaded into the die cavity such that the powder was in direct contact with the walls of the die cavity. After consolidation, the resulting target blank was typically formed, such as by machining, grinding, polishing, etc., into a finished target. Detailed descriptions of a number of prior processes for making ITO sputtering targets may be found in U.S. Pat. Nos. 5,160,675 and 5,094,787 and in Japanese Patent Nos. 04341504, 04293769, 04154654, 04074860, 03199373 and 02043356.

The production of metal oxide targets, notably ITO targets, using graphite die assemblies have been known to exhibit a number of chronic problems associated with interaction between the powdered target starting material and the graphite material of the die assembly. The problems have included full reduction of the metal oxide to metal, at least in the form of a layer on the outer surface of the resulting target blank. Removal of this metal layer is generally necessary before the target is suitable for use. However, removal of the reduced metal, for example, a layer of indium or indium-tin alloy on an ITO target, often results in cracks in the target or fracturing of the target, which then must be scrapped. Also, the formation of cracks in the target reduces its resistance to fracturing during use. Lower pressing temperatures and/or shorter pressing times have been used in order to avoid the formation of a reduced metal layer while still using a graphite die assembly to press the powder. Pressing at lower temperatures and/or for shorter times typically results in poor consolidation of the powdered target starting material, which in turn results in targets with low density, low strength and/or a low resistance to fracturing (i.e., low toughness).

The density, strength and toughness of a target are often very important to the target's performance. Reportedly, high density ITO targets are required in order to sputter high quality ITO thin films, in particular, thin films free from particles. In addition, good strength and toughness are typically necessary to successfully form the ITO target blank into the desired final target shape. ITO targets with good toughness are also less likely to fracture during the sputtering process. Such fracturing can result in relatively large particles being deposited onto the substrate, often generating defects in the ITO film. Such defects in the ITO film can adversely affect the electro-optic properties of the film.

ITO and other such metal oxide sputtering targets produced with die assemblies made of a ceramic, such as $Al_2O_3$ or $ZrO_2$, are less likely to exhibit the problems noted above when graphite die assemblies are used. However, such ceramic die assemblies are generally more expensive to manufacture, less resistant to thermal shock and not as thermally conductive as comparable graphite die assemblies. Ceramic dies are thus more likely to crack during use, require longer heating and soaking times during the hot-pressing operation, and generally increase the costs of the target manufacturing process.

Therefore, there is a need for a more cost effective method and apparatus for manufacturing denser, stronger and tougher sputtering targets made from volatile and thermally unstable metal oxides.

SUMMARY OF THE INVENTION

The present invention is directed to a less expensive apparatus and process for consistently making acceptable sputtering targets by hot-pressing metal oxides that are volatile and thermally unstable at the hot-pressing temperature.

A general aspect of the present invention is directed to such an apparatus and process using a graphite die assembly.

A particular aspect of the present invention is directed to such an apparatus and process for consistently making relatively higher density, higher strength and tougher indium oxide and tin oxide (ITO) sputtering targets using a graphite die assembly.

According to the general principles of the present invention, a powder of a first material, also termed a target starting material, which includes metal oxide particles, is surrounded by a barrier material, as the first material is hot-pressed at an elevated temperature into a target blank in an oxygen-free, preferably inert, gas environment. The metal oxide particles in the powdered target starting material are volatile and thermally unstable at the elevated hot-pressing temperature. The barrier material is not in powder form, but is in the form of a solid sleeve which is thermally stable at elevated temperatures. In the present invention, first the barrier sleeve is placed in the die cavity of a graphite die assembly, followed by the target starting material. While in the die cavity encased by the barrier sleeve, the target starting material is bonded together (or sintered) by applying a sufficiently high temperature and pressure, for a long enough period of time, to produce a metal oxide sputtering target having a density, strength and toughness suitable for sputtering films of desirable quality. The barrier material sleeve is intended to substantially prevent a reducing gas from penetrating therethrough and reaching the unstable target starting material during the hot-pressing operation, thereby preventing any significant degree of full reduction of the metal oxide target material to metal. Preferably, the barrier material sleeve is also sufficient to substantially protect the graphite die assembly from attack and degradation by any dissociated components of the metal oxides during hot-pressing.

At elevated hot-pressing temperatures, the volatile and thermally unstable metal oxides break down or dissociate into oxygen gas and reduced oxides which may or may not be volatile, depending upon the temperature attained. For example, when the ITO material is subjected to hot-pressing temperatures of greater than or equal to about 850° C., the $In_2O_3$ may begin to dissociate into free and reactive oxygen gas and other lower order indium oxides. Depending upon the hot-pressing temperature, some of these other indium oxides, such as $In_2O$, may vaporize, while the balance of the indium oxide remains stable (i.e., in solid form). The dissociation of $In_2O_3$ is evidenced by color changes in the ITO material. $In_2O_3$ is yellow, while $In_2O$ is black. Typically, it is desirable for the target to have a uniform color which is indicative of a uniform composition. For at least some ITO targets, a uniform dark blue color is preferred. The present invention enables targets with such a uniform color to be consistently produced in a cost effective manner.

In the absence of the protection afforded by the barrier material sleeve, hot-pressing at such elevated temperatures will likely result in the oxygen (O) gas reacting with carbon (C) from the graphite die assembly, generating carbon monoxide (CO) gas. The CO gas will in turn react with $In_2O_3$ and other indium oxides, thereby forming metallic indium (In) and carbon dioxide ($CO_2$). The resulting indium metal melts and tends to diffuse into the remaining oxide material such that the target blank has an outer coating of this reduced metal with an inner core of any remaining metal oxide. Because the indium metal is difficult to remove without cracking or fracturing the target blank, such blanks are typically unsuitable for further processing into finished targets and are scrapped. In addition, reduction of the ITO material has been found to shorten the life of the graphite die due to oxidation of the graphite by the liberated oxygen gas. Oxidation of the graphite may cause the die to crack during hot-pressing. Thus, it has been found that by isolating the powdered ITO target starting material with an appropriate barrier material sleeve, reduction of the indium oxide to indium metal during hot-pressing and the problems associated therewith may be eliminated or at least significantly reduced.

In one embodiment of the ITO target manufacturing apparatus and process of the present invention, a barrier material sleeve surrounds or encases the powdered ITO target starting material in order to better ensure that an adequate barrier is provided. The barrier sleeve may be a metal oxide, such as $Al_2O_3$, $ZrO_2$, $TiO_2$, MgO and combinations thereof, or a non-oxide ceramic, such as SiC, SiN, and combinations thereof.

Prior attempts at avoiding significant reduction of the powdered ITO target starting material, which would enable continued use of graphite die assemblies, have included lowering the hot-pressing temperature and/or shortening the time duration of the hot-pressing operation. However, such process changes typically resulted in target blanks having undesirable mechanical properties (i.e., low density, strength and toughness). Implementation of the barrier sleeve according to the present invention has enabled much higher pressing temperatures and longer pressing times to be used with graphite dies while significantly decreasing the amount of ITO material reduced to metal, as well as decreasing oxidation of the graphite dies. In this way, relatively low cost targets having improved physical properties may be manufactured.

Even when ITO and other metal oxide target starting materials are protected from reducing gases as described above, the starting material still may be partially reduced, thereby dissociating vaporous and gaseous components. The extent of such dissociation typically depends on the pressing temperature and the time at that temperature. It has been determined that when these vapors and gases are trapped inside the powdered target material and not allowed to escape, lower quality targets may be produced. Trapped vapor or gas tends to cause inconsistent consolidation of the powdered target material (i.e., bonding between powder particles), thereby lowering the density, strength and toughness of the final target. Such retained vapor or gas also tends to cause poor color uniformity in the resulting target. It is believed that such discoloration may be due, at least in part, to the trapped vapors and gases recombining into higher order oxides of different color(s) when the target blank is cooling.

It has been found that smaller targets do not exhibit the above noted problems associated with such retained gases to the same extent as larger targets. It is believed that there are two primary causes for this difference. For larger targets, more powdered target starting material is used which causes a proportional increase in the production of dissociated vaporous and gaseous components. In addition, because of the target's larger size, the vapors and gases produced near the center of the powdered target material have further to travel to exit from the die cavity. This is best understood with reference to a typical graphite die assembly, which includes a cylindrical die tube or ring and two opposing cylindrical die punches that slide longitudinally within the die ring, compressing the powder therebetween. The interior of the die cavity is defined by the leading surfaces of the two die punches and the inside surface of the die ring, with the only escape for vapor or gas being between the die punches and the die ring. Generally, this is insufficient to vent trapped vapors and gases in larger targets.

To avoid the drawbacks of retaining vapors and gases in the powdered target material during hot-pressing, an optional feature of the present apparatus and method was developed to minimize the amount of trapped vapor and gas. This feature includes a gas release device which facilitates the venting of vapor and gas from the die cavity. In general, the gas release device has two surfaces connected by a plurality of pathways. The gas release device is disposed within the die cavity such that one surface faces the powdered target material and the other surface faces at least one wall of the die cavity, or a barrier sleeve within the die cavity. The pathways in the gas release device are constructed so that vapor and gas generated during hot-pressing flows from the powdered target material, through the pathways and out of the die cavity between the die punches and the die ring.

In one embodiment, the gas release device is a perforated disk having two flat surfaces. Two such disks are positioned in the die cavity, each with one surface facing a respective die punch, or a barrier sleeve element within the die cavity, and the other surface facing the powdered target material. Each disk has a plurality of channels or grooves formed in the surface facing the die punch or barrier sleeve element. Each groove leads to the outer edge or periphery of the disk. A plurality of through holes connect these grooves to the surface of the disk facing inwardly toward the target material. In this way, vapor and gas escaping from the powdered target material can flow through the holes, along the grooves to the outer periphery of the disk, and out of the die assembly between the die punches and the die ring or barrier sleeve. By venting more of the dissociated vapors and gases, targets may be produced which exhibit higher densities, greater strength, and better toughness, while maintaining more uniform color.

Yet another feature of the present invention further reduces the amount of vapor and gas retained in the powdered target material during hot-pressing. This is accomplished by subjecting the target starting material to a heat treatment before the hot-pressing operation. This heat treatment involves heating the starting powder to a temperature which causes partial reduction of the metal oxide without bonding the powder particles together (i.e., sintering) to any significant degree. In this way, at least some of the dissociated vaporous and gaseous components of the target starting material are driven off before the hot-pressing operation. Thus, smaller amounts of vapor and gas are produced during hot-pressing and captured within the powdered target starting material. This preliminary heat treatment should be performed in an oxygen-free environment, such as an inert gas atmosphere. Preferably, a mild reducing environment can be used to accelerate this partial reduction while avoiding any significant grain growth (i.e., sintering) or formation of reduced metal. For example, a sheet of graphite foil may be introduced into the heat treatment environment to cause this acceleration. Thus, by partially reducing the powdered target material before hot-pressing, targets having even higher densities, greater strength, better toughness and more uniform color may be obtained.

In the present target manufacturing apparatus and process, the barrier material sleeve is intended to provide a barrier for the powdered metal oxide target material and substantially prevent contact with any reducing gas coming from the graphite die material. This barrier sleeve eliminates or at least significantly avoids full reduction of the metal oxide into metal, as well as oxidation of the graphite die material. Thus, the present invention makes it possible to use graphite die assemblies to hot-press powders of ITO materials, and similar volatile and thermally unstable metal oxides, into denser, stronger and tougher sputtering targets than heretofore thought possible. In addition, a gas release feature of the present invention significantly reduces the amount of vapor or gas trapped in the powdered target starting material during hot-pressing, thus enabling such targets to be made with even better properties, including more uniform color. To further reduce the amount of these vapors and gases trapped in the powdered target starting material, and thereby further improve the target properties, the powdered target starting material may be subjected to a heat treatment to drive off a portion of such volatiles before hot-pressing. Utilizing the principles of the present invention, ITO sputtering targets have been produced which exhibit a minimum density of about 90% (6.45 g/cc) of theoretical density and a minimum flexure strength of about 90 MPa, with high crack resistance (i.e., toughness) and color uniformity.

The principles of the present invention, its objectives and advantages will be further understood with reference to the drawings and the following detailed description.

DETAILED DESCRIPTION OF THE INVENTION

While the method and apparatus of the present invention are described with specific reference to an ITO target starting material, the invention is not to be so limited, but is applicable to other volatile and thermally unstable metal oxide target starting materials.

Referring to FIGS. 1–4, the materials and equipment utilized in a target manufacturing process according to the present invention include a target starting material 11 in powder form which is hot-pressed at an elevated temperature into a target blank (not shown) using a graphite die assembly 12. The powdered target material 11 includes particles of metal oxide which are volatile and thermally unstable at the elevated temperatures reached during the hot-pressing operation. For exemplary purposes only, the powdered target material 11 described in detail herein is an indium oxide and tin oxide (ITO) powder blend comprising two powdered constituents, $In_2O_3$ and $SnO_2$. Satisfactory results have been obtained in the process and apparatus of the present invention using a powder blend of about 5% to about 15% by weight $SnO_2$ and the balance being substantially $In_2O_3$, with powder sizes (i.e., the size of aggregate particles) being less than about 325 mesh (44 microns) and individual particles being less than about 1 micron in size. The grain sizes of exemplary targets produced from such target starting powders 11 have been found to be in the range of about 1 micron to 15 microns. It is believed that the principles of the present invention are equally applicable to other ITO materials such as $In_2SnO_5$, as well as other volatile and thermally unstable metal oxide target materials.

Figure 1:
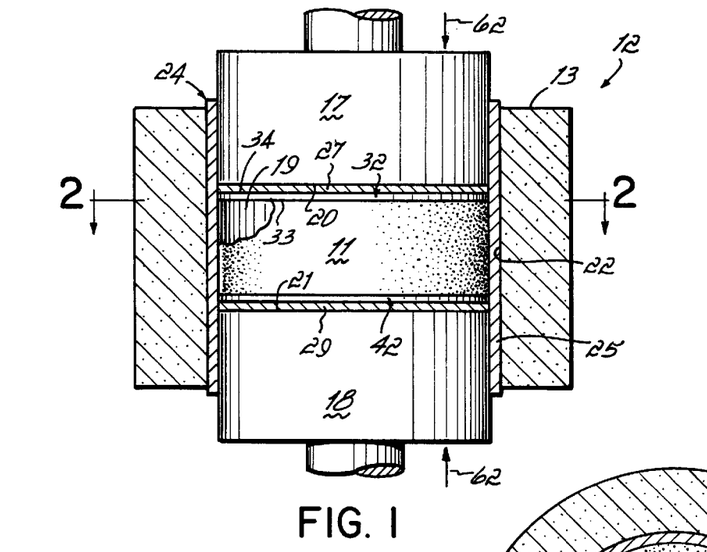
FIG. 1 is a schematic, sectional view of a graphite die assembly including a barrier sleeve and loaded with a powdered target starting material, in accordance with the present invention.

As shown in FIG. 1, graphite die assembly 12 includes a cylindrical graphite tube or ring 13 and a pair of opposing graphite punches 17 and 18 which generally are dimensioned to slide relative to graphite ring 13 in accordance with well known graphite die assembly construction. Except for those elements, features and modifications described in detail herein, the graphite die assembly 12 used in the present invention is constructed and operated in accordance with well established manufacturing and operating techniques. Related equipment which does not constitute a part of the present invention is readily known and understood by persons skilled in the art and is therefore not described in detail herein.

The graphite die assembly 12 defines a die cavity 19 in which the ITO powder 11 is pressed. The die cavity 19 includes a top wall 20 which is the leading surface of the upper punch 17, a bottom wall 21 which is the leading surface of the lower punch 18, and a side wall 22 which is the inside surface of the die ring 13. As discussed hereinabove, unless the ITO powder 11 is isolated from the graphite walls 20, 21 and 22, then at the elevated temperatures reached during the present hot-pressing operation the ITO powder 11 and carbon from the graphite walls 20, 21 and 22 would react and form a fully reduced indium metal layer surrounding any remaining ITO powder 11. Additionally, the graphite material would degrade, resulting in cracking of the die assembly 12. Therefore, a barrier material sleeve 24 is preferably used to eliminate or at least substantially prevent the full reduction of powdered ITO target material 11 to metal and degradation of the graphite die material.

Figure 2:
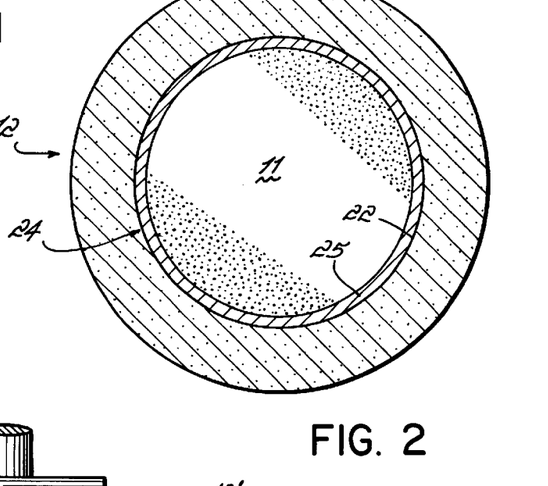
FIG. 2 is a cross-sectional view taken along line 2—2 of FIG. 1.

As shown in FIGS. 1 and 2, barrier sleeve 24 comprises a cylindrical or ring-shaped member 25 which fits within graphite ring 13 and confronts side wall 22 thereof. Barrier sleeve 24 further includes upper and lower circular plates 27 and 29, respectively, which fit snugly within but are slidable relative to cylindrical sleeve 25. Upper and lower plates 27 and 29 confront top wall 20 and bottom wall 21, respectively, of die cavity 19. In this way, graphite die assembly 12 is completely isolated from direct contact with target starting material 11 by barrier sleeve 24.

Figure 3:
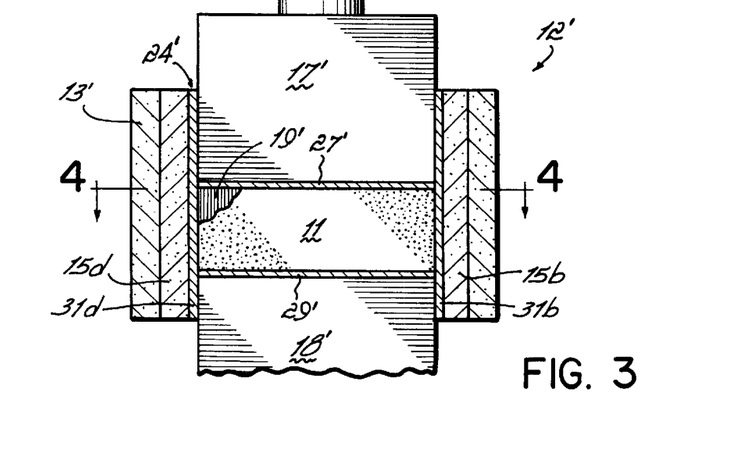
FIG. 3 is a schematic, sectional view of an alternative embodiment of a graphite die assembly including a barrier sleeve and loaded with a powdered target starting material.
Figure 4:
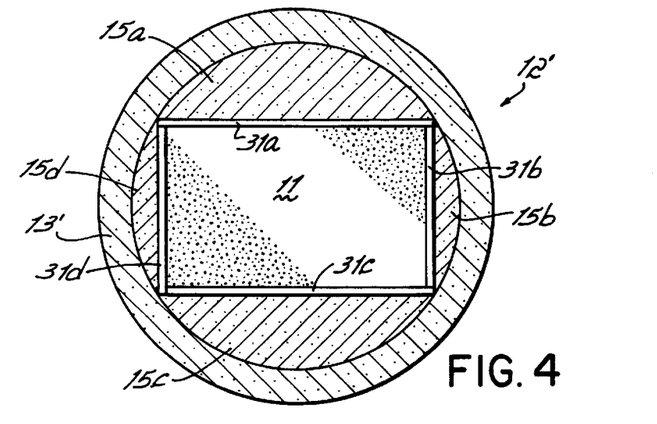
FIG. 4 is a cross-sectional view taken along line 4—4 of FIG. 3.

FIGS. 3 and 4 show an alternative embodiment wherein the die assembly is used to make rectangular sputtering targets rather than the disk-shaped targets produced using the apparatus shown in FIGS. 1 and 2. With specific reference to FIGS. 3 and 4, graphite die assembly 12' includes an outer cylindrical graphite ring 13' and a pair of opposing graphite punches 17', 18' which are rectangular in cross-section. In order to define a die cavity which is rectangular in cross-section, die assembly 12' also includes four graphite die elements 15a, b, c and d, each of which is an appropriately dimensioned element having a circle segment cross-section so as to define the sides of rectangular cavity 19'. In this embodiment, barrier sleeve 24' is comprised of a plurality of plates 31a, b, c and d which confront graphite die elements 15a, b, c and d, respectively, so as to define the side walls of a cavity of rectangular cross-section. Barrier sleeve 24' further includes upper and lower plates 27', 29' which confront the upper and lower graphite punches 17' and 18', respectively.

It will be appreciated by persons skilled in the art that ITO sputtering targets having a desired shape can be manufactured simply by modifying the graphite die assembly, graphite punches and barrier sleeve configuration to define the appropriately shaped cavity for pressing target starting material 11.

Barrier sleeves used in accordance with the present invention are preferably ceramic, made from a material selected from the group consisting of $Al_2O_3$, MgO, $ZrO_2$, SiC and SiN. It will be appreciated that the ceramic plates (27, 29, 27', 29') placed between the punches (17, 18, 17', 18') and the powder 11 are subjected to a higher stress than ring-shaped sleeve 25 or rectangular side sleeves 31a–d. In these circumstances, a higher strength (i.e., greater toughness) ceramic material may be used for the upper and lower plates, and the rectangular side sleeves or ring may be a relatively lower strength ceramic, thereby lowering the cost of the overall assembly. Preferably, each component of ceramic barrier sleeves 24, 24' have a thickness in the range of from 0.1" to 0.5". These ceramic components preferably have a density which is at least about 90% of the theoretical density. It will be appreciated that lower density ceramic sleeves may permit the reactive gases (CO, O and $In_2O$) to penetrate therethrough, thereby deleteriously affecting the final target. In general, there should be a tight fit between the graphite outer ring and the barrier sleeve. However, there should be a gap of about 0.01" to 0.02" between punches 17, 18 or 17', 18' and barrier sleeve 25 or sleeve members 31a–d, to assure that the punches can be moved during pressing but which will permit escape of the reactive gases therebetween.

The powder used for the target material 11 may be produced using well known powder preparation techniques, such as ball milling. However, such powder making techniques do not form a part of the present invention and therefore are not described in detail. The purity of the starting powders 11 and the exemplary ITO targets produced therefrom according to the present invention was typically greater than about 99.99% and 99.95%, respectively. With an ITO starting powder 11 of 5 wt % $SnO_2$, balance $In_2O_3$ (theoretical oxygen content of 60 atomic % or 17.49 wt %), the typical oxygen content of the resulting ITO targets was about 54.8 to about 55.3 at % (17.1 to 17.3 wt %).

Generally referring to FIG. 1, with barrier sleeve 24 in place, ITO powder 11 is loaded into die cavity 19 to a depth in the range of about 2 to 3 inches, depending upon the desired final target thickness. The ITO powder 11 is then tamped down with hand pressure and leveled. Preferably, prior to loading the target starting material into die cavity 19, an optional gas release device 42 (shown in FIG. 5) is positioned on top of the bottom wall 21 (i.e., the leading surface of barrier plate 29). The details of gas release device 42 will be described hereinbelow. After the tamping step, an upper gas release disk 32 is placed on top of the ITO powder 11. Thereafter, upper barrier plate 27 is placed over the gas release disk. Finally, upper punch 17 is positioned on top of the plate 27 as shown in FIG. 1, and the ITO powder 11 is ready to be hot-pressed.

Figure 5:
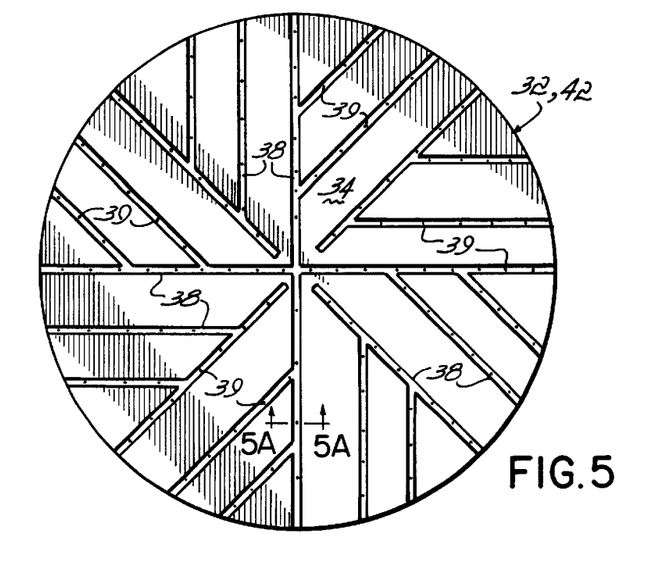
FIG. 5 is a bottom plan view of a gas release device, in accordance with the present invention.
Figures 5A, 6:
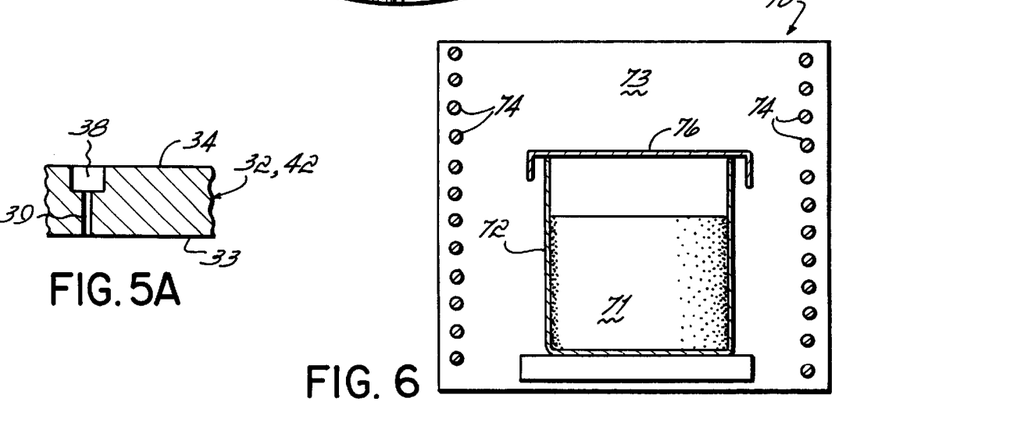
FIG. 5A is an enlarged cross-sectional view taken along line 5A—5A of FIG. 5.
FIG. 6 is a schematic, sectional view of an apparatus for heat treating the present powdered target starting material prior to hot-pressing according to the principles of the present invention.

With reference to FIGS. 5 and 5A, one embodiment of the gas release device 32 is a disk having a first surface 33 and a second surface 34. A plurality of channels or grooves 38 are formed in second surface 34 and connected to first surface 33 by a plurality of through holes 39. The disk 32 is dimensioned to cover bottom wall 21 of die cavity 19, with second surface 34 facing toward the bottom wall 21. A second gas release disk 42, having the same faces 33, 34, grooves 38 and through holes 39, is similarly oriented with respect to the top wall 20 of die cavity 19. These gas release disks are made entirely out of a ceramic, such as $Al_2O_3$, MgO, $ZrO_2$, $TiO_2$, SiC, SiN or combinations thereof. The width of each groove 38 is in the range of about 0.05 inches to about 0.3 inches and preferably about 0.1 inches. The depth of each groove 38 is in the range of about 0.02 inches to about 0.1 inches, with a preferable lower limit of about 0.05 inches. In addition, the distance between any two adjacent parallel grooves is in the range of about 0.1 inches to about 1.0 inches, and preferably is about 0.75 inches. The diameter of each through hole 39 is in the range of about 0.02 inches to about 0.07 inches, and preferably is about 0.05 inches. The distance between adjacent holes 39 is in the range of about 0.1 inches to about 1.0 inches, and preferably in the range of about 0.25 inches to about 0.5 inches. The thickness of each gas release disk 32, 42 (FIG. 1) is in the range of about 0.1 inches to about 1.0 inches for ceramic coated graphite disks, and in the range of about 0.1 inches to about 0.2 inches for ceramic disks. Preferably, the disks have a thickness of about 0.25 inches regardless of what material they are made of.

During the hot-pressing operation, the ITO powder blend 11 consolidates, with individual particles bonding together. When the ITO powder 11 is hot-pressed at temperatures higher than about 800° C., the ITO material, and in particular the indium oxide ($In_2O_3$), begins to dissociate into vaporous and gaseous components. The amount of vapor and gas produced depends upon the hot-pressing temperature, the time at that temperature, and the amount of ITO powder 11 being pressed. For example, $In_2O_3$ may dissociate into $In_2O$ vapor and oxygen gas. As the hot-pressing operation progresses, dissociated vapor and gas released from the ITO powder 11 escapes from die cavity 19 between the graphite punches 17, 18 and barrier sleeve ring-shaped member 25. The barrier sleeve is intended to prevent the resulting reducing gases, such as CO, from subsequently attacking and reducing the ITO material to metal. Thus, the barrier sleeve is utilized to prevent these escaping vapors and gases from oxidizing and deteriorating the graphite walls 20, 21 and 22 of die cavity 19, and to prevent carbon from the graphite die assembly 12 from penetrating through to the ITO powder 11.

Because it has a longer distance to travel to escape, dissociated vapor and gas generated at the center of the ITO powder 11 may become trapped inside of the resulting ITO target (not shown). This is especially true with regard to larger diameter targets. Targets having diameters of about 10 inches or more have been known to exhibit a significant amount of retained vapor and gas. Contributing to this problem is the tendency of the ITO powder 11 to condense in a non-uniform manner, with the outer regions condensing and loosing porosity first, thereby trapping such vapor or gas before it can escape. It has been found that smaller targets about 5 inches in diameter do not exhibit as much retained vapor and gas as larger targets of 10 inches in diameter or more.

As with other known sputtering targets, ITO targets of various sizes and shapes have been used to sputter ITO films. ITO sputtering targets are typically circular shaped disks having diameters up to about 12.5 inches, with a thickness of up to about 5 inches, and preferably with a thickness in the range of about 0.15 inches to about 1.0 inches. Rectangular shaped ITO targets have also been used. These targets typically have a length and width ranging respectively from about 15×5 inches to about 40×10 inches, with a thickness comparable to that of the previously described circular disk shaped targets. Although the die cavity 19 shown in FIGS. 1 and 2 is circular in cross-section, those skilled in the art will readily understand that graphite die assembly 12 may be adapted to define a die cavity 19 suitable for forming rectangular (see FIGS. 3 and 4) or other shaped targets. In this embodiment, rectangular shaped die punches 17', 18' are used instead of circular die punches 17, 18. In addition, the gas release devices 32, 42 could be made rectangular shaped rather than circular as illustrated in FIG. 5. The present invention is not intended to be limited by the shape or size of the particular targets.

Gas release disk 32, 42 facilitates the release of dissociated vapors and gases from the ITO powder 11 before the powder 11 is fully densified by providing readily available pathways for the vapor and gas to exit the die cavity 19. Thus, vapor and gas escape through holes 39 and are channeled along grooves 38 outwardly toward the outer edge of the ITO powder 11 to escape from die cavity 19 between the graphite punches 17 and 18 and the barrier ring 25. While use of the gas release disks may not be necessary to produce smaller targets having desirable properties, their use does tend to ensure satisfactory density, consolidation and color uniformity of the target, even for smaller targets, and therefore, their use is preferred.

In addition to reducing the amount of vapor and gas trapped in the ITO powder 11 by using the gas release disks during hot-pressing, the amount of trapped vapor and gas may be reduced even more by using a preliminary heat treatment step. Before the ITO powder 11 is deposited into the die cavity 19, it is preferably subjected to heat treatment comprising heating at least the indium oxide ($In_2O_3$) powder component of the ITO powder blend 11 to a temperature in the range of 1100° C. to 1600° C. in an inert environment and under no pressure. In this way, at least some of the volatile vapors and gases are driven off before the hot-pressing operation.

In particular, referring to FIG. 6, the preliminary heat treatment preferably includes loading a powder blend 71 of fully oxidized, yellow, indium oxide ($In_2O_3$) powder blended with tin oxide ($SnO_2$) powder into a conventional ceramic crucible 72, such as those made of $Al_2O_3$, $ZrO_2$, MgO or the like. The loaded crucible is then placed in a furnace 70 having a chamber 73 and heating elements 74, which are capable of heating the chamber to a temperature of 1600° C. under an inert gas atmosphere. The furnace chamber 73 is purged with an inert gas, such as argon (Ar), at a rate in the range of about 100 standard cubic feet per hour (SCFH) to about 200 SCFH. The furnace chamber 73 should be purged in this manner regardless of whether a ceramic or graphite furnace 70 is used. With a graphite furnace, the argon atmosphere protects the graphite heating elements 74 from the oxidation that may otherwise occur if the outside air were allowed to enter the chamber 73. Even though a ceramic furnace would not require such protection, the argon atmosphere is necessary in order to obtain significant partial reduction of the $In_2O_3$ powder since $In_2O_3$ tends to remain stable when heated in an air or oxygen atmosphere. The loaded crucible 72 is then heated to a temperature in the range of about 1100° C. to about 1600° C. The heat treatment temperature is maintained for a time in the range of about 5 hours to about 20 hours. No pressure is applied to the ITO powder 71 during this heat treatment. The heating temperatures and times chosen should be those which will result in the degree of partial reduction of the ITO powder 71 desired. In this way, the initially yellow indium oxide ($In_2O_3$) can be partially reduced to blue indium oxide or some other indium oxide desired. The relatively small amount of tin oxide ($SnO_2$) present in the powder blend 11 generally will have little effect on the overall color of the powder 11. Complete partial reduction of the ITO powder may not be possible without some bonding between the powder particles. If the particles bond together, however, it will be more difficult to consolidate the powder 71 and obtain the density desired during subsequent hot-pressing. Therefore, the temperature and time at temperature should be chosen to maximize the degree of partial reduction without the particles bonding together.

In order to increase the amount of partial reduction for a given temperature and time at temperature, the opening to the crucible 72 may be covered with a thin foil 76 of graphite before the crucible 72 is placed in the furnace chamber 73. After the ITO powder blend 71 has been heated to the desired temperature for the time desired, the furnace 70 is turned off and the loaded crucible 72 is allowed to cool to room temperature while remaining in the furnace chamber 73 under the inert gas atmosphere. When room temperature is reached, the powder 71 may be removed and loaded into the die assembly 12 as previously described. By partially reducing the ITO powder before the hot-pressing operation, stronger and tougher targets with higher densities and more uniform color may be produced.

As an example of the preliminary heat treatment operation, 7 kg of ITO powder 11 was deposited into a ceramic crucible that was 12 inches high, with a 6 inch inside diameter and an 8 inch outside diameter. A graphite foil 76 was used to cover the opening of the crucible. The foil had a thickness that ranged from about 0.015 inches to about 0.02 inches, and preferably about 0.02 inches. The loaded crucible 72 was covered with the foil 76 and heated to a temperature of about 1200° C. and held at that temperature for about 10 hours. The furnace chamber 73 was continuously purged with argon gas flowing at about 150 SCFH immediately before, during and after the heating operation until the furnace 70 cooled to about room temperature.

Figure 7:
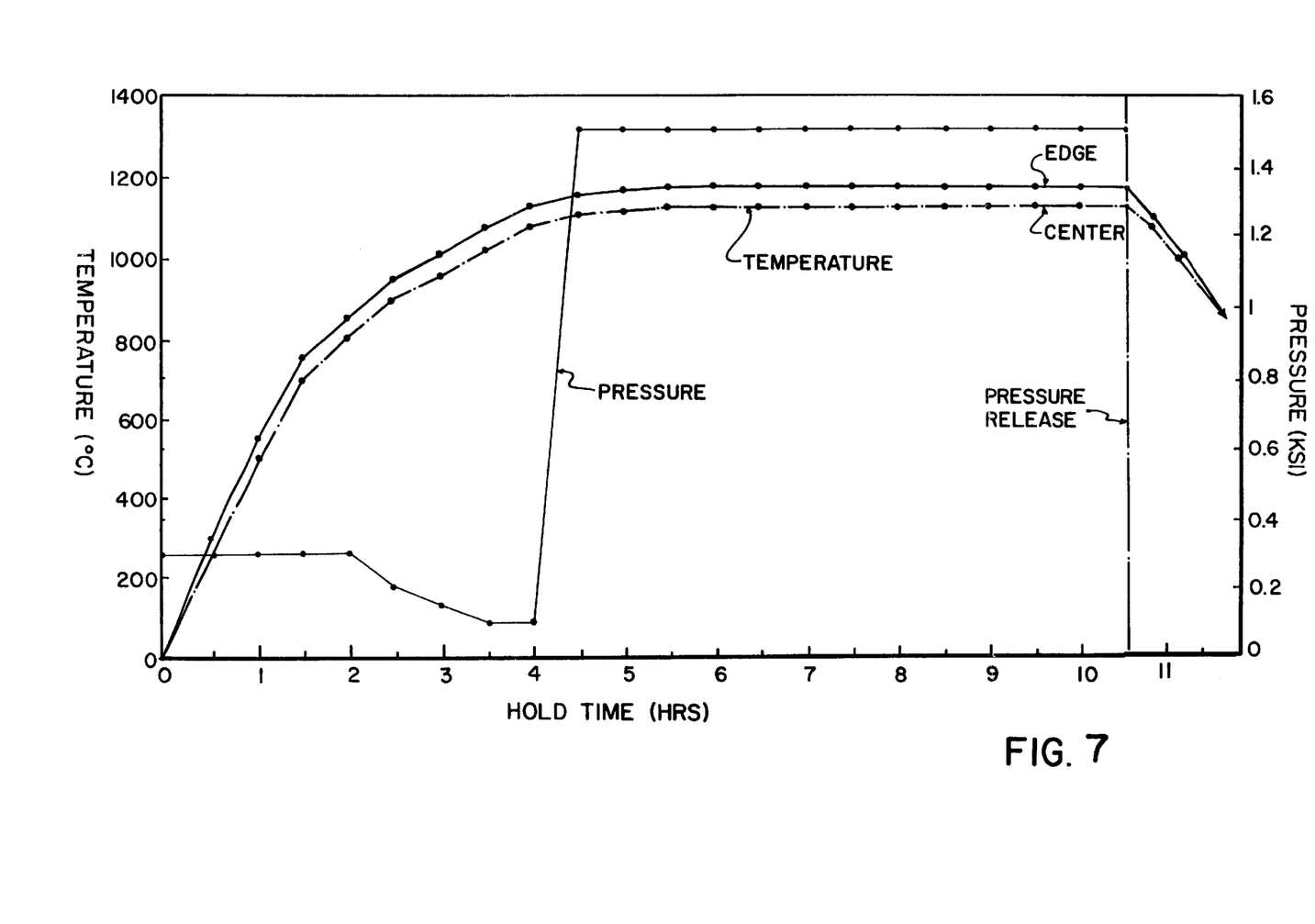
FIG. 7 is a graph showing various parameters of a hot-pressing operation for producing an exemplary ITO sputtering target according to the principles of the present invention.

ITO sputtering targets have been produced according to the principles of the present invention using a consolidation operation which included subjecting the ITO powder 71 to the previously described preliminary heat treatment and then hot-pressing the resulting ITO powder 11 in die assembly 12 in the manner previously described, and including using gas release disks 32, 42. With reference to FIG. 7, which graphically represents the basic pressing cycle used in ITO target production, the ITO powder 11 was initially cold-pressed up to about 0.3 ksi (e.g., 4 tons of force applied to a 5.5 inch diameter circular area) at room temperature (about 20° C.) for about 5 minutes. The pressure was applied in the direction of arrows 62 as shown in FIG. 1. After the initial cold-pressing step, the temperature was incrementally increased at a rate controlled to within the range of about 1° C./minute to about 5° C./minute. The temperature inside the die cavity 19 was monitored by using two thermocouples (not shown) positioned inside the die assembly 12. A hole was drilled through the upper punch 17 and both thermocouples were threaded therethrough and positioned between the barrier plate 27 and the upper gas release disk (not shown). One thermocouple was located along the outer edge and the other thermocouple located in the center of the plate 27 and the disk.

By way of example, the pressing cycle used in forming ITO sputtering targets generally followed the cycle graphically illustrated in FIG. 7 and tabulated below.

TABLE

PRESSING CYCLE OF ITO TARGET PRODUCTIONS

| Time (minutes) | Temperature (° C.) Center | Temperature (° C.) Edge | Pressure (ksi) |
|---|---|---|---|
| 0 | 20 | 20 | 0.3 |
| 30 | 250 | 300 | 0.3 |
| 60 | 500 | 550 | 0.3 |
| 90 | 700 | 750 | 0.3 |
| 120 | 800 | 850 | 0.3 |
| 150 | 900 | 950 | 0.2 |
| 180 | 950 | 1000 | 0.15 |
| 210 | 1020 | 1070 | 0.1 |
| 240 | 1075 | 1125 | 0.1 |
| 270 | 1100 | 1150 | 1.5 |
| 300 | 1110 | 1160 | 1.5 |
| 330 | 1120 | 1170 | 1.5 |
| 360 | 1120 | 1170 | 1.5 |
| 390 | 1120 | 1170 | 1.5 |
| 420 | 1120 | 1170 | 1.5 |
| 450 | 1120 | 1170 | 1.5 |
| 480 | 1120 | 1170 | 1.5 |
| 510 | 1120 | 1170 | 1.5 |
| 540 | 1120 | 1170 | 1.5 |
| 570 | 1120 | 1170 | 1.5 |
| 600 | 1120 | 1170 | 1.5 |
| 630 | 1120 | 1170 | 1.5 → 0 |
| 645 | 1067 | 1077 | 0 |
| 715 | 917 | 918 | 0 |

More particularly, the ITO powder 11 was heated to a temperature of about 800° C. Large temperature gradients in the ITO powder 11 during the hot-pressing consolidation process have been found to cause a discoloration of the finished target. It appears that this discoloration may be avoided by controlling the temperature differential between the center and the outer edge of the powder package to about 50° C. or less. As the powder 11 began to sinter, the pressure was allowed to drop freely. During this time, the applied temperature continued to increase and when the temperature reached about 1100° C. as reflected by the center thermocouple (not shown) and about 1150° C. as reflected by the outer edge thermocouple (not shown), the temperature was held substantially constant for about 10 minutes before any additional pressure was applied. After this period of time, a minimum of about 1.3 ksi, and preferably about 1.5 ksi, was applied by the graphite die assembly 12. The 1150° C. edge temperature and 1.5 ksi applied pressure was maintained for about 5 hours. After this time, the pressure was released, the furnace was allowed to cool, and the pressed ITO target blank (not shown) was removed from the die cavity 19. It is believed that ITO targets with high density, strength and toughness may also be obtained using a final pressing temperature anywhere in the range of about 1,000° C. to about 1,500° C., with the heating rate being controlled to within the range of about 1° C./minute to about 5° C./minute, while maintaining a pressure in the range of about 1 ksi to about 5 ksi for more than 2 hours.

After the hot-pressing operation is complete and the ITO powder 11 has been consolidated and allowed to cool, the resulting target blank is removed from the die assembly 12. Once removed from die assembly 12, the ITO target blank may be shaped into its final form, such as by machining. Typically, the surface of the resulting target blank must be finished to a very smooth condition before it is suitable for use as a sputtering target. Such surface finishing may be accomplished by grinding and/or polishing, depending on the final surface finish required. The finished target is then mounted to a backing plate, typically a copper plate, using standard target mounting techniques. The details of such surface finishing and mounting operations do not form a basis for the present invention, are readily known by those skilled in the art of making sputtering targets, and are therefore not included in any detail except as described herein.

The target densities obtainable with the present apparatus and process are.in the range of about 90% to about 100% of theoretical density. When the ITO powder blend 11 is partially reduced using the preliminary heat treatment, target densities obtained using the preceding hot-pressing operation have consistently been in the range of about 96% to about 98% of theoretical density. Without the preliminary heat treatment, ITO targets produced according to the principles of the present invention typically exhibited densities in the range of about 90% to about 93% of theoretical density. The flexure strengths of ITO targets manufactured according to the principles of the present invention have typically been greater than 90 MPa and have averaged about 110 MPa. In addition, the fracture mode exhibited by these targets has been transgranular, which is indicative of excellent consolidation of the ITO powder particles (i.e., strong bonding between the particles). These targets also exhibited a uniform dark blue color.

Prior ITO target manufacturing processes using graphite die assemblies without a barrier sleeve and using similar hot-pressing parameters (e.g., similar temperatures and times at temperature) typically exhibit a significant amount of indium oxide reduced to indium metal, a high evaporation rate of the ITO material and severe oxidation of the graphite die assembly. In an attempt to avoid these disadvantages, the ITO powders were hot-pressed and/or non-graphite die assemblies were used. However, targets produced by hot-pressing ITO powders at lower temperatures, 1000° C. or less, typically exhibited low densities of about 70% of theoretical density or less and low strengths of about 60 MPa or less. In addition, the fracture mode exhibited was typically intergranular, which is indicative of poor consolidation. The use of non-graphite die assemblies, such as those made of ceramics like $Al_2O_3$ or $ZrO_2$, also has problems. In general, such ceramic die assemblies are more likely to form cracks while in use, require longer heating and soaking times during the hot-pressing operation, and generally increase the costs of the target manufacturing process.

While the present invention has been described with reference to a preferred embodiment and exemplary metal oxide target materials, it will be understood by those skilled in the art that various changes may be made and equivalents may be substituted for elements thereof without departing from the scope of the invention. In addition, many modifications could be made to adapt the method and apparatus for use with various materials in accordance with the teachings of the invention without departing from the essential scope thereof.

Therefore, it is intended that the present invention not be limited to the particular embodiment disclosed, but that the invention encompasses all embodiments falling within the scope of the appended claims.

What is claimed is:

1. Apparatus for making metal oxide sputtering targets, comprising:

a graphite die assembly, including a graphite ring and a pair of opposing graphite punches, defining a die cavity for hot-pressing a powdered metal oxide target starting material which includes an indium oxide and tin oxide into a metal oxide sputtering target; and a barrier sleeve lining said graphite die assembly die cavity and providing a barrier between said graphite die assembly and the powdered metal oxide target starting material, said barrier sleeve being made of a material selected from the group consisting of $Al_2O_3$, MgO, $ZrO_2$, SiC and $Si_3N_4$, and being capable of withstanding hot-pressing at a temperature of at least 1100° C.;

whereby said barrier sleeve substantially prevents a reducing gas from penetrating to the powdered metal oxide target starting material, said barrier sleeve being substantially unreactive with the powdered target starting material during hot pressing, and said powdered target starting material being volatile and thermally unstable during hot pressing.

2. The apparatus of claim 1 wherein said barrier sleeve has a thickness in the range of about 0.1 " to 0.2".

3. The apparatus of claim 1 wherein said die cavity has a circular cross-section so as to form sputtering targets having a circular cross-section.

4. The apparatus of claim 3 wherein said barrier sleeve is comprised of a cylindrical ring-shaped member lining said graphite ring of said die assembly, and two complementary barrier end plates, each lining one of said opposing graphite punches of said die assembly.

5. The apparatus of claim 4 wherein said ring-shaped member is made of a first ceramic material and said barrier end plates are made of a second ceramic material.

6. The apparatus of claim 1 further comprising:

a structural gas release device having a first surface and an outer edge, said first surface being connected to said outer edge by a plurality of pathways, said gas release device being disposed within said die cavity with said first surface facing away from the powdered metal oxide target starting material, said gas release device being capable of withstanding hot-pressing at a temperature of at least 1100 ° C.

7. The apparatus of claim 6 wherein said gas release device is disposed within said die cavity between said powdered target starting material and said barrier sleeve.

8. The apparatus of claim 7 wherein said first surface confronts said barrier sleeve.

9. A process for making metal oxide sputtering targets, comprising the steps of:

providing a graphite die assembly, including a graphite ring and a pair of opposing graphite punches, defining a die cavity with a barrier sleeve lining said die cavity, said barrier sleeve being made of a ceramic selected from the group consisting of $Al_2O_3$, MgO, $ZrO_2$, SiC and $Si_3N_4$ and combinations thereof, and said barrier sleeve being capable of withstanding hot-pressing at a temperature of at least 1100 ° C.;

loading a powdered metal oxide sputtering target starting material including an indium oxide and tin oxide into said die cavity such that said powdered starting material is substantially completely surrounded by said barrier sleeve; and hot-pressing the powdered metal oxide sputtering target starting material at an elevated temperature of at least 1100° C. in the graphite die assembly to produce a metal oxide target blank, wherein the target starting material is volatile and thermally unstable at the elevated temperature and the barrier sleeve substantially prevents a reducing gas from penetrating therethrough to the target starting material during the hot-pressing step.

10. The process of claim 9 the target starting material including particles of $In_2O_3$ and $SnO_2$.

11. The process of claim 10 the target starting material containing in the range of about 5 to about 15 weight percent $SnO_2$, with the balance being substantially all $In_2O_3$.

12. The process of claim 9, said barrier sleeve having a thickness in the range of 0.1" to 0.5".

13. The process of claim 9 further comprising:

installing a structural gas release device having a first surface, an outer edge and a plurality of pathways interconnecting the first surface and the outer edge within said die cavity such that said first surface faces and confronts said barrier sleeve during the hot pressing operation, said gas release device being capable of withstanding hot-pressing at a temperature of at least 1100° C.

14. The process of claim 11 further comprising:

heat treating said powdered target starting material prior to loading said material into said die cavity to partially reduce said powder without said powder being substantially bonded together.

15. The process of claim 14 wherein said heat treating step is performed in an inert atmosphere.

* * * * *